(12) United States Patent
Kitazawa

(10) Patent No.: US 12,068,280 B2
(45) Date of Patent: Aug. 20, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hideaki Kitazawa, Kamakura Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 239 days.

(21) Appl. No.: 17/193,703

(22) Filed: Mar. 5, 2021

(65) Prior Publication Data
US 2022/0093562 A1   Mar. 24, 2022

(30) Foreign Application Priority Data
Sep. 23, 2020   (JP) .................................. 2020-158215

(51) Int. Cl.
*H01L 25/065*     (2023.01)
*H01L 23/00*      (2006.01)
(Continued)

(52) U.S. Cl.
CPC .......... *H01L 25/0655* (2013.01); *H01L 23/02* (2013.01); *H01L 23/40* (2013.01); *H01L 24/72* (2013.01)

(58) Field of Classification Search
CPC ..... H01L 25/0655; H01L 23/02; H01L 23/40; H01L 24/72; H01L 2224/05553;
(Continued)

(56) References Cited

U.S. PATENT DOCUMENTS 4,246,596 A * 1/1981 Iwasaki .................. H01L 29/744
257/E23.028
4,402,004 A * 8/1983 Iwasaki .................. H01L 29/744
257/E23.028
(Continued)

FOREIGN PATENT DOCUMENTS

CN    107833913 A    3/2018
EP    0962973 A1    12/1999
(Continued)

*Primary Examiner* — Bitew A Dinke
(74) *Attorney, Agent, or Firm* — Kim & Stewart LLP

(57) ABSTRACT

There is provided a semiconductor device including a first electrode including a first plate portion, the first plate portion including a first surface and a second surface facing the first surface, a plurality of semiconductor chips provided above the second surface, and a second electrode including a second plate portion provided above the semiconductor chips, the second plate portion including a third surface facing the second surface and a fourth surface facing the third surface, the second plate portion including a plurality of protrusion portions provided between the semiconductor chips and the third surface, the protrusion portions being connected to the third surface, each of the protrusion portions including a top surface including the same shape as a shape of each of the semiconductor chips in a plane parallel to the second surface, the second plate portion including a second outer diameter larger than a first diameter of a smallest circle circumscribing the protrusion portions provided on an outermost side among the protrusion portions in a plane parallel to the third surface, and a third plate portion including a fifth surface connected to the fourth surface and a sixth surface facing the fifth surface, the third plate portion including a third outer diameter equal to or smaller than the first diameter.

4 Claims, 10 Drawing Sheets

(51) Int. Cl.
  *H01L 23/02* (2006.01)
  *H01L 23/40* (2006.01)
(58) Field of Classification Search
  CPC ... H01L 2924/1203; H01L 2924/13055; H01L 2924/15747; H01L 2924/181; H01L 23/142; H01L 23/36; H01L 24/05; H01L 25/072; H01L 23/051
  See application file for complete search history.

(56) References Cited

U.S. PATENT DOCUMENTS

| | | | | |
|---|---|---|---|---|
| 5,708,299 | A * | 1/1998 | Teramae | H01L 25/072 257/718 |
| 5,866,944 | A * | 2/1999 | Hiyoshi | H01L 24/72 257/178 |
| 6,181,007 | B1 | 1/2001 | Yamazaki | H01L 25/115 257/E25.026 |
| 6,967,357 | B1 * | 11/2005 | Kon | H03K 17/168 257/785 |
| 9,818,705 | B1 * | 11/2017 | Kuwahara | H01L 23/051 |
| 10,002,821 | B1 * | 6/2018 | Hoegerl | H01L 23/051 |
| 2001/0011757 | A1 * | 8/2001 | Miyake | H01L 23/051 257/415 |
| 2002/0005578 | A1 * | 1/2002 | Kodama | H01L 24/72 257/718 |
| 2002/0154482 | A1 * | 10/2002 | Miyake | H01L 23/051 257/E21.515 |
| 2004/0021149 | A1 * | 2/2004 | Kitazawa | H01L 25/072 257/E23.101 |
| 2004/0119148 | A1 * | 6/2004 | Standing | H01L 25/072 257/668 |
| 2013/0020694 | A1 * | 1/2013 | Liang | H01L 23/473 257/691 |
| 2014/0327127 | A1 * | 11/2014 | Hable | H01L 24/36 438/122 |
| 2015/0028467 | A1 * | 1/2015 | Yokoyama | H01L 25/50 257/676 |
| 2015/0054166 | A1 * | 2/2015 | Beer | H01L 21/78 257/773 |
| 2015/0061100 | A1 * | 3/2015 | Beer | H01L 23/051 257/676 |
| 2015/0061144 | A1 * | 3/2015 | Beer | H01L 21/561 257/773 |
| 2016/0113107 | A1 * | 4/2016 | Wang | H05K 3/3431 361/783 |
| 2016/0126157 | A1 * | 5/2016 | Jeon | H01L 23/3675 257/693 |
| 2016/0126212 | A1 * | 5/2016 | Hohlfeld | H01L 24/90 257/688 |
| 2017/0033091 | A1 | 2/2017 | Schenk et al. | |
| 2017/0194301 | A1 * | 7/2017 | Golland | H01L 23/3675 |
| 2017/0207211 | A1 * | 7/2017 | Kuwahara | H01L 23/373 |
| 2017/0287875 | A1 * | 10/2017 | Gao | H01L 21/486 |
| 2017/0365583 | A1 * | 12/2017 | Im | H01L 21/565 |
| 2018/0174945 | A1 * | 6/2018 | Park | H01L 23/3677 |
| 2019/0341332 | A1 * | 11/2019 | Lin | H01L 25/18 |
| 2020/0035579 | A1 * | 1/2020 | Hoegerl | H01L 23/49531 |
| 2020/0395266 | A1 * | 12/2020 | Hoegerl | H01L 21/565 |
| 2021/0296217 | A1 * | 9/2021 | Tang | G01K 1/16 |
| 2021/0359592 | A1 * | 11/2021 | Michiaki | H02M 7/003 |

FOREIGN PATENT DOCUMENTS

| | | |
|---|---|---|
| EP | 3462479 A1 | 4/2019 |
| JP | H11-274400 A | 10/1999 |
| JP | 2005-50909 A | 2/2005 |
| JP | 2005-209784 A | 8/2005 |
| JP | 2010-87438 A | 4/2010 |
| JP | 2012-244076 A | 12/2012 |
| JP | 2015-198132 A | 11/2015 |
| JP | 2018-046190 A | 3/2018 |
| JP | 2019-047591 A | 3/2019 |
| WO | 2019/116736 A1 | 6/2019 |

* cited by examiner

B-B'

A-A'

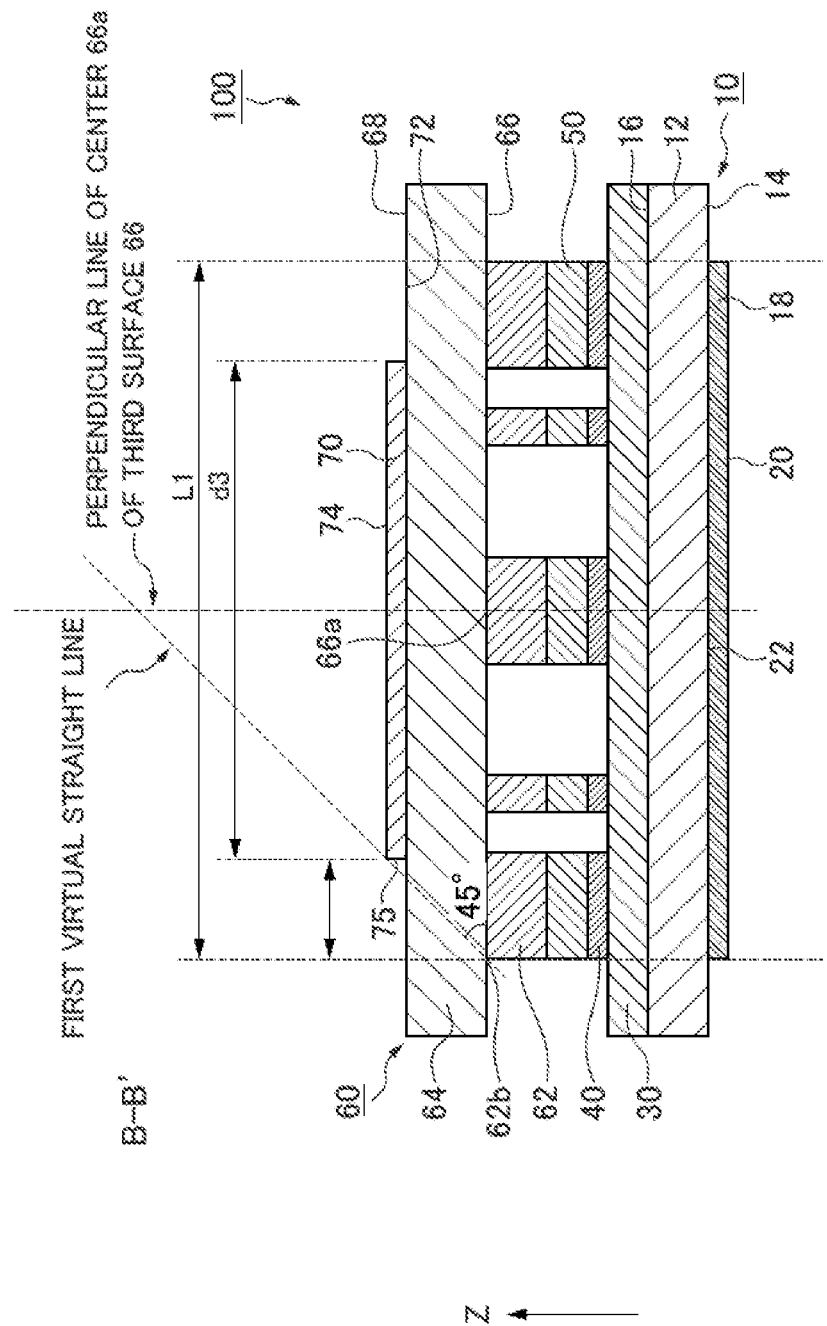

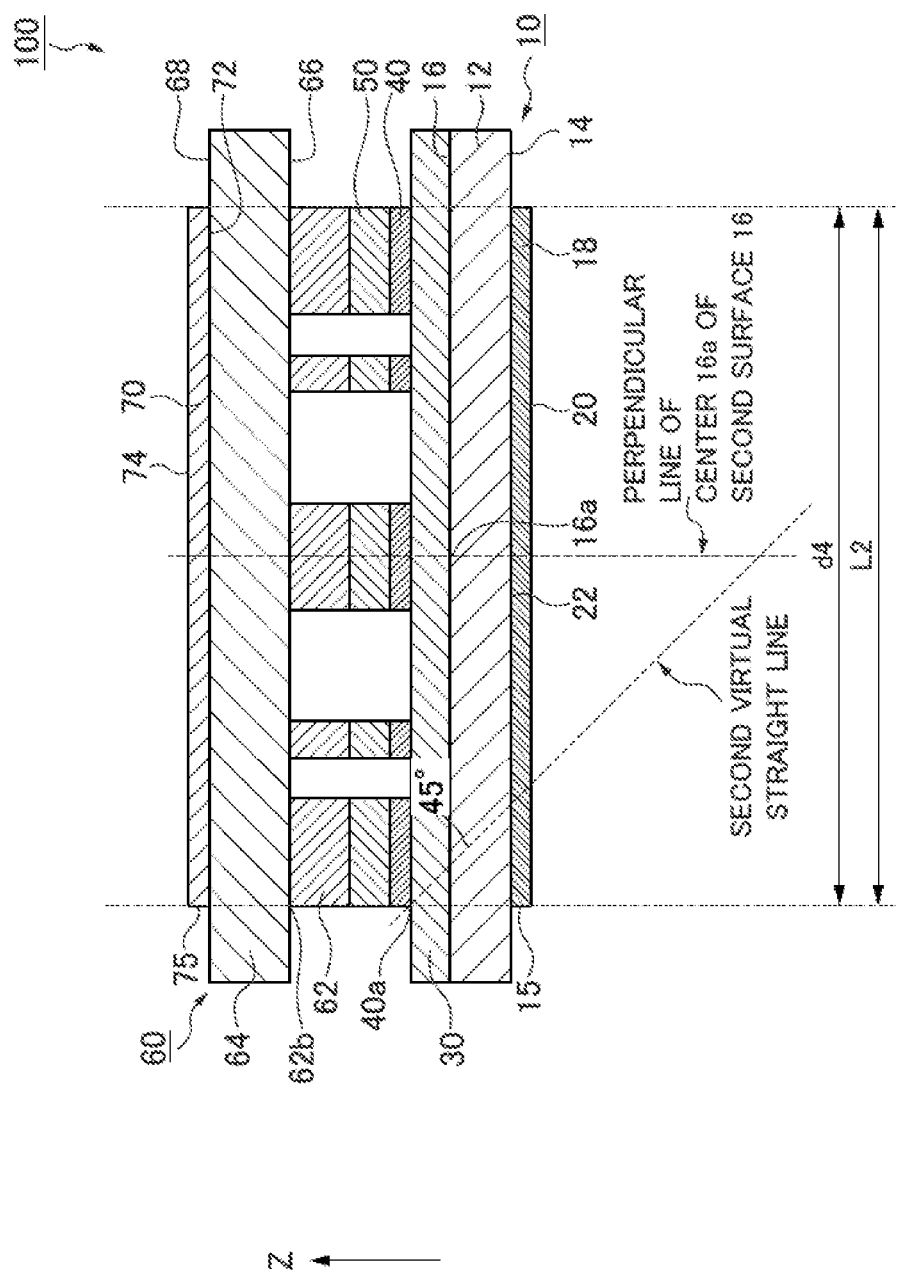

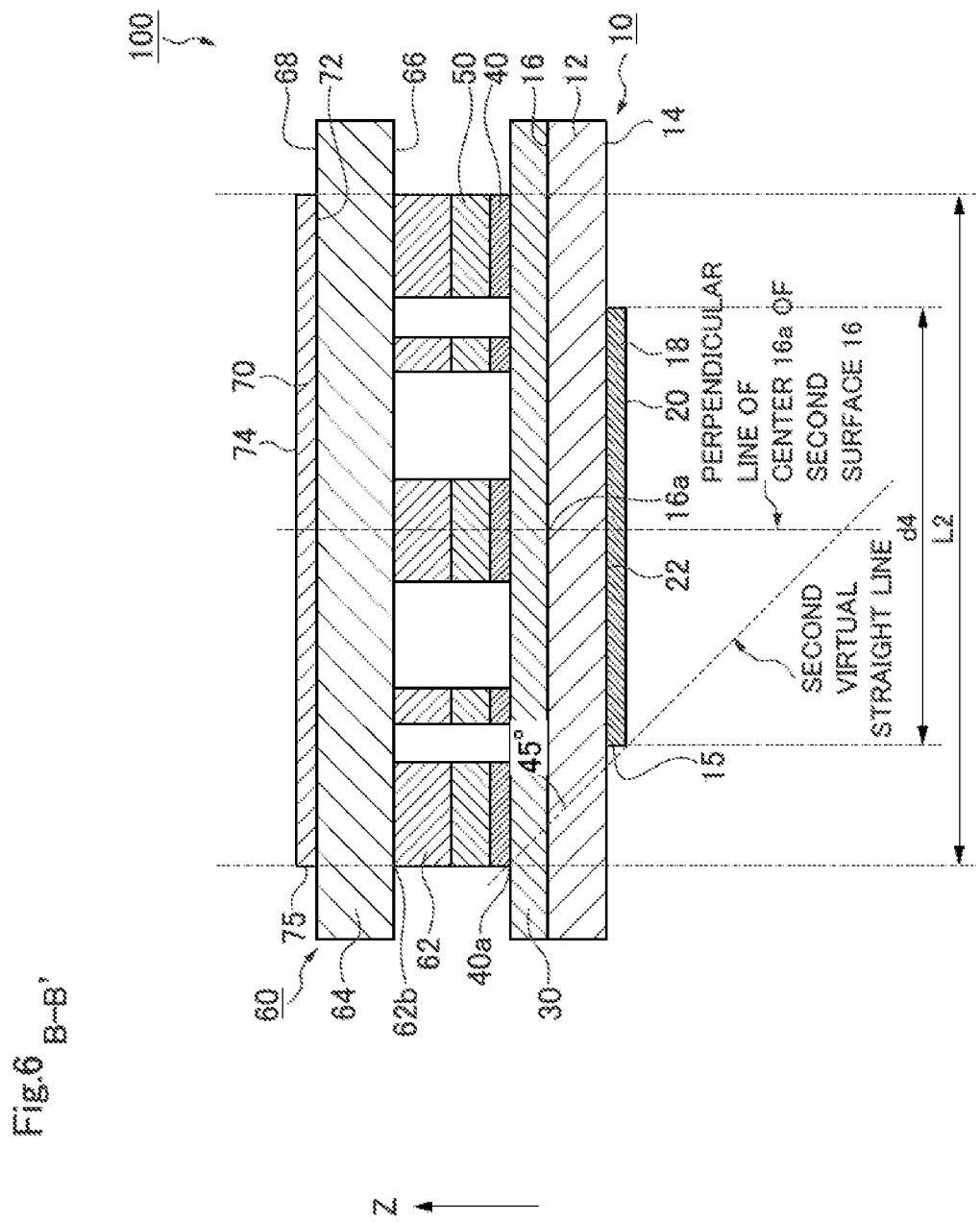

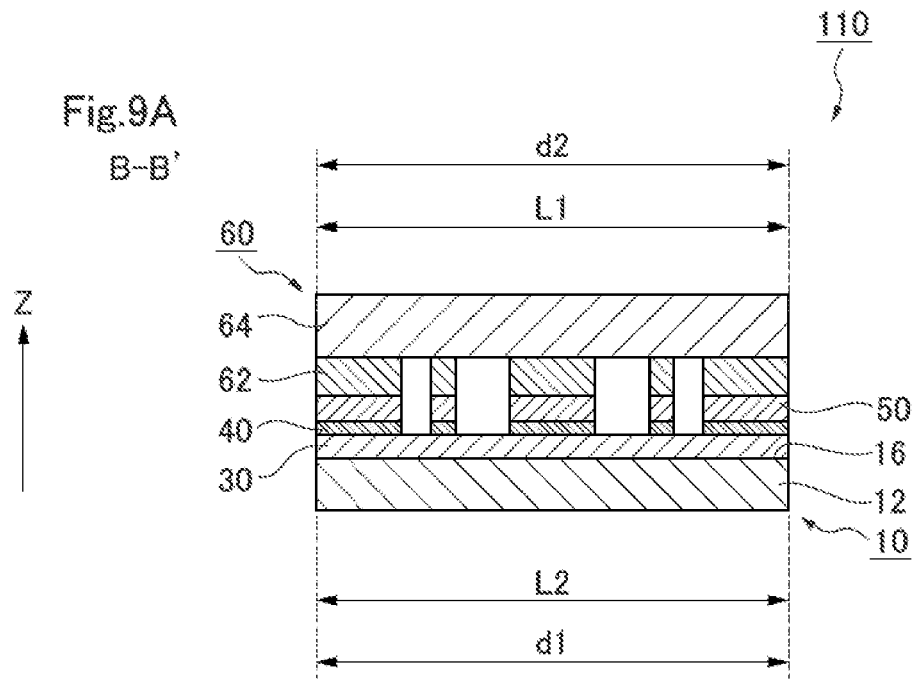
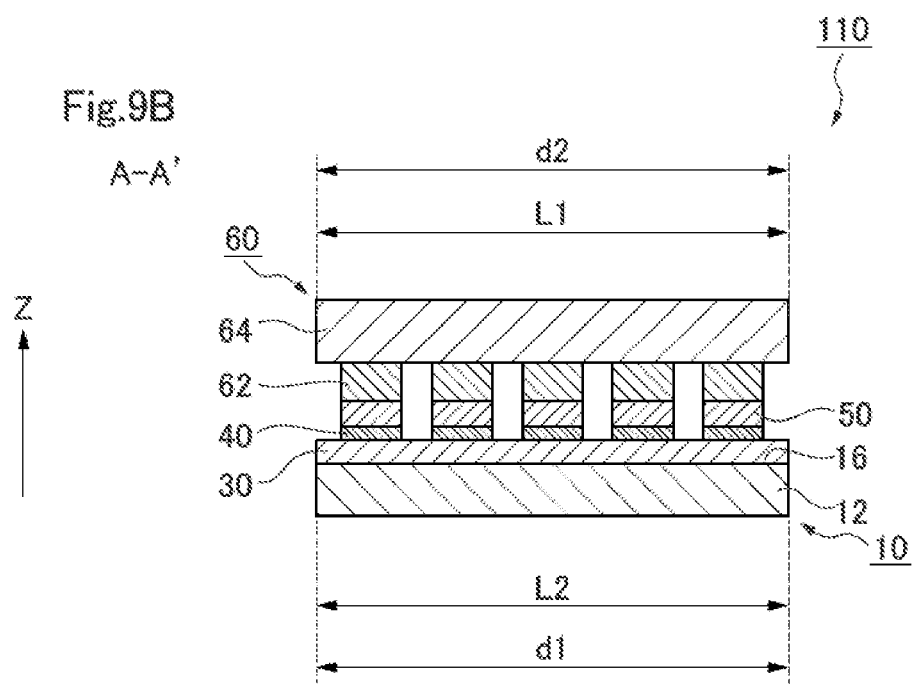

SEMICONDUCTOR DEVICE

CROSS-REFERENCE TO RELATED APPLICATION

This application is based upon and claims the benefit of priority from Japanese Patent Application No. 2020-158215, filed on Sep. 23, 2020, the entire contents of which are incorporated herein by reference.

FIELD

Embodiments described herein relate generally to a semiconductor device.

BACKGROUND

A press pack semiconductor device achieves improvement of power density by heat dissipation on both surfaces and high reliability under high voltage and large current. The press pack semiconductor device has a structure in which a plurality of semiconductor elements is sandwiched between upper and lower electrode blocks. A pressing force is applied to the upper and lower electrode blocks from the outside, and thus, internal electrical contact is maintained.

The use of the press pack semiconductor device involves generation of heat. Thus, it is required to reduce thermal resistance in the press pack semiconductor device.

BRIEF DESCRIPTION OF THE DRAWINGS

FIG. 4 is an example of the schematic cross-sectional view of the semiconductor device of the first embodiment;

FIG. 5 is an example of the schematic cross-sectional view of the semiconductor device of the first embodiment;

FIG. 6 is an example of the schematic cross-sectional view of the semiconductor device of the first embodiment;

FIGS. 9A and 9B are schematic cross-sectional views of a semiconductor device of a second embodiment.

DETAILED DESCRIPTION

Figure 1A:
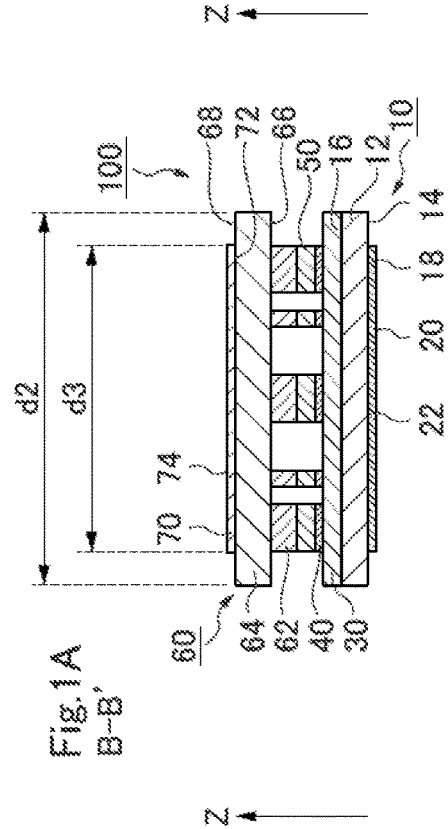
FIGS. 1A to 1C are schematic diagrams of a semiconductor device of a first embodiment.

Hereinafter, embodiments of the present disclosure will be described with reference to the drawings. In the following description, the same members and the like are given by the same reference numerals, and the description of the members and the like once described will be omitted as appropriate.

In the present specification, in order to show a locational relationship between components and the like, an upward direction of the drawing is described as "upper" and a downward direction of the drawing is described as "lower".

In the present specification, the terms "upper" and "lower" are not necessarily terms indicating a relationship with a direction of gravity.

First Embodiment

A semiconductor device of the present embodiment includes a first electrode including a first plate portion, the first plate portion including a first surface and a second surface facing the first surface, a plurality of semiconductor chips provided above the second surface, and a second electrode including a second plate portion provided above the semiconductor chips, the second plate portion including a third surface facing the second surface and a fourth surface facing the third surface, the second plate portion including a plurality of protrusion portions provided between the semiconductor chips and the third surface, the protrusion portions being connected to the third surface, each of the protrusion portions including a top surface including the same shape as a shape of each of the semiconductor chips in a plane parallel to the second surface, the second plate portion including a second outer diameter larger than a first diameter of a smallest circle circumscribing the protrusion portions provided on an outermost side among the protrusion portions in a plane parallel to the third surface, and a third plate portion including a fifth surface connected to the fourth surface and a sixth surface facing the fifth surface, the third plate portion including a third outer diameter equal to or smaller than the first diameter.

Figure 1B:
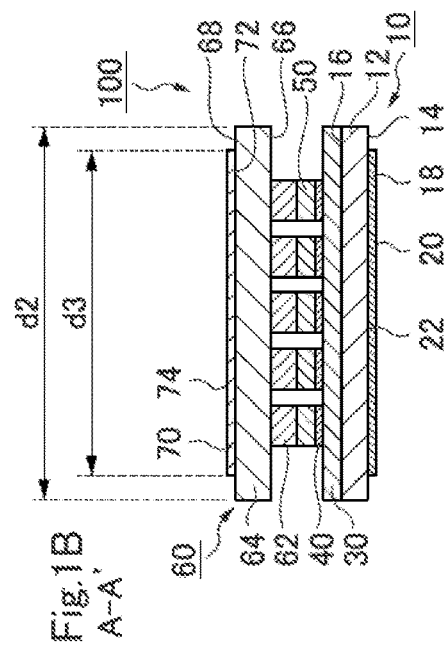
Figure 1C:
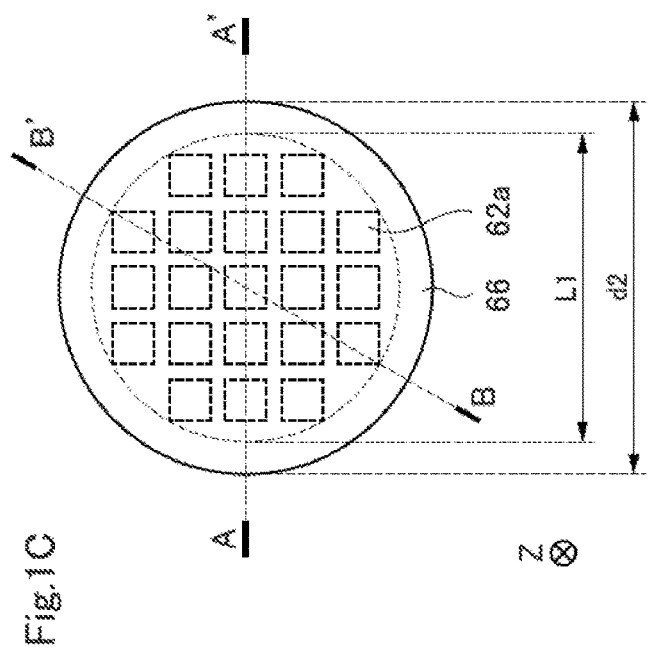

FIGS. 1A to 1C are schematic diagrams of a semiconductor device 100 of the present embodiment. FIG. 1A is a schematic cross-sectional view of the semiconductor device 100 of the present embodiment. FIG. 1B is a schematic cross-sectional view of the semiconductor device 100 of the present embodiment. FIG. 1C is a schematic bottom view of a third surface 66 of a second plate portion 64 of the semiconductor device 100 of the present embodiment. More specifically, FIG. 1A is a schematic cross-sectional view of the semiconductor device 100 in a B-B' cross section shown in FIG. 1C. FIG. 1B is a schematic cross-sectional view of the semiconductor device 100 in an A-A' cross section shown in FIG. 1C.

Figure 2A:
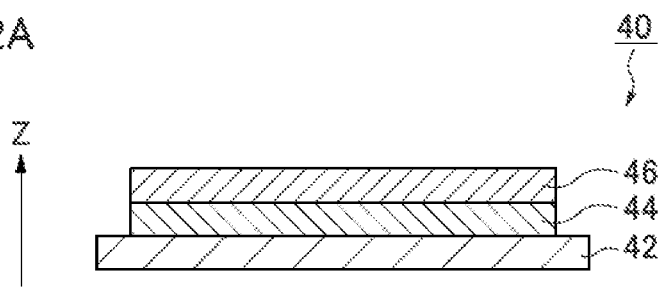
FIGS. 2A and 2B are schematic cross-sectional views of a semiconductor chip of the first embodiment.
Figure 2B:
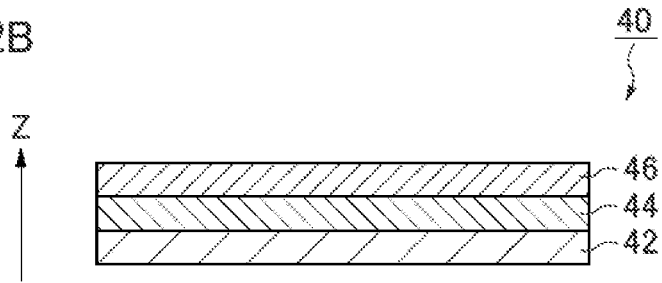

FIGS. 2A and 2B are schematic cross-sectional views of a semiconductor chip 40 of the present embodiment.

The semiconductor device 100 of the present embodiment will be described with reference to FIGS. 1A to 1C and 2A and 2B.

The semiconductor device 100 of the present embodiment is a press pack semiconductor device.

The semiconductor device 100 includes a first electrode 10, a first buffer portion 30, semiconductor chips 40, second buffer portions 50, and a second electrode 60.

The first electrode 10 includes a first plate portion 12 and a fourth plate portion 18. The first electrode 10 is an electrode containing, for example, metal such as copper (Cu).

The first plate portion 12 is, for example, a plate-like member. The first plate portion 12 is, for example, a member including a columnar shape. The first plate portion 12 includes a first surface 14 and a second surface 16 facing the first surface 14. Here, for example, it is assumed that the first surface 14 and the second surface 16 are provided in a plane perpendicular to a Z-axis.

The first buffer portion 30 is provided on the second surface 16 of the first plate portion 12. The first buffer portion 30 is provided to relieve thermal stress applied to the semiconductor chips 40 when the first electrode 10 and the second electrode 60 are press-packed. The first buffer portion 30 contains conductive metal such as molybdenum (Mo).

The semiconductor chips 40 are provided on the first buffer portion 30. The semiconductor chip 40 includes a first chip electrode 42, a semiconductor element region 44 provided on the first chip electrode 42, and a second chip electrode 46 provided on the semiconductor element region 44. For example, the number of semiconductor chips 40 is the same as the number of protrusion portions 62 to be described later. The semiconductor chip 40 is, for example, an insulated gate bipolar transistor (IGBT). When the semiconductor chip 40 is the IGBT, for example, the first chip electrode 42 is a collector electrode and the second chip electrode 46 is an emitter electrode. However, the semiconductor chip 40 is not limited to the IGBT, and may be a metal oxide semiconductor field effect transistor (MOSFET) or a diode. For example, shapes of the first chip electrode 42, the semiconductor element region 44, and the second chip electrode 46 are rectangular in the plane perpendicular to the Z-axis or in a plane parallel to the second surface 16. However, the shapes of the first chip electrode 42, the semiconductor element region 44, and the second chip electrode 46 in the plane perpendicular to the Z-axis are not limited to the rectangle.

In the semiconductor chip 40 shown in FIG. 2A, the sizes of the semiconductor element region 44 and the second chip electrode 46 are smaller than the size of the first chip electrode 42 in order to secure a creepage distance. However, the sizes of the first chip electrode 42, the semiconductor element region 44, and the second chip electrode 46 may be the same as in the semiconductor chip 40 shown in FIG. 2B.

The second electrode 60 includes the protrusion portions 62, the second plate portion 64, and a third plate portion 70. The second electrode 60 is an electrode containing, for example, metal such as copper (Cu).

The second plate portion 64 is provided above the semiconductor chips 40. The second plate portion 64 includes the third surface 66 and a fourth surface 68 facing the third surface 66. The third surface 66 faces the second surface 16. The second plate portion 64 includes the plurality of protrusion portions 62. Each of the plurality of protrusion portions 62 is provided between each of the plurality of semiconductor chips 40 and the third surface 66. The plurality of protrusion portions 62 is connected to the third surface 66.

As shown in FIG. 1C, the second plate portion 64 includes, for example, a total of 21 protrusion portions 62. However, the number of protrusion portions 62 is not limited thereto. When the shape of the semiconductor chip 40 is rectangular, a top surface 62a of the protrusion portion 62 in the plane perpendicular to the Z-axis or in the plane parallel to the second surface 16 includes the same rectangular shape as the shape of the semiconductor chip 40. For example, when the semiconductor chip 40 shown in FIG. 2A is used, the top surface 62a of the protrusion portion 62 in the plane perpendicular to the Z-axis or in the plane parallel to the second surface 16 includes the same rectangular shape as the shape of the second chip electrode 46 of the semiconductor chip 40. For example, when the semiconductor chip 40 shown in FIG. 2B is used, the top surface 62a of the protrusion portion 62 in the plane perpendicular to the Z-axis or in the plane parallel to the second surface 16 includes the same rectangular shape as the shapes of the first chip electrode 42, the semiconductor element region 44, and the second chip electrode 46 of the semiconductor chip 40.

The second plate portion 64 includes a second outer diameter $d_2$ larger than a first diameter $L_1$ (FIG. 1C) of the protrusion portion 62 in a plane parallel to the third surface 66. Here, the first diameter $L_1$ of the protrusion portion 62 is a diameter of a smallest circle circumscribing the plurality of protrusion portions 62 provided on an outermost side among the plurality of protrusion portions 62 in the plane parallel to the third surface 66. The protrusion portions 62 are arranged in, for example, a matrix inside the circle.

The third plate portion 70 includes a fifth surface 72 and a sixth surface 74. For example, it is assumed that the fifth surface 72 and the sixth surface 74 are provided in the plane perpendicular to the Z-axis. The fifth surface 72 is connected to the fourth surface 68 of the second plate portion 64. The third plate portion 70 includes a third outer diameter $d_3$ equal to or smaller than the first diameter $L_1$.

The second buffer portions 50 are provided between the semiconductor chips 40 and the protrusion portions 62, respectively. In the semiconductor device 100 of the present embodiment, the plurality of second buffer portions 50 are provided. However, a form of the second buffer portion 50 is not limited thereto. The second buffer portions 50 are provided to relieve the thermal stress applied to the semiconductor chips 40 when the first electrode 10 and the second electrode 60 are press-packed. The second buffer portion 50 contains conductive metal such as molybdenum (Mo). For example, the shape and size of each second buffer portion 50 in the plane perpendicular to the Z-axis are the same as the shape and size of each semiconductor chip 40 in the plane perpendicular to the Z-axis.

In FIG. 1C, the shape and size of the first buffer portion 30 in the plane perpendicular to the Z-axis, in other words, in the plane parallel to the second surface 16 are the same as the shape and size of the second surface 16 of the first plate portion 12 in the plane perpendicular to the Z-axis. The shape and size of the second buffer portion 50 in the plane perpendicular to the Z-axis are the same as the shape and size of the top surface 62a of the protrusion portion 62 in the plane perpendicular to the Z-axis. However, the shapes of the first buffer portion 30 and the second buffer portion 50 are not limited thereto.

A resin support (not shown) may be provided around the semiconductor chips 40, the second buffer portions 50, and the protrusion portions 62. A ceramic insulating member (not shown) may be provided around the semiconductor device 100.

Figure 3:
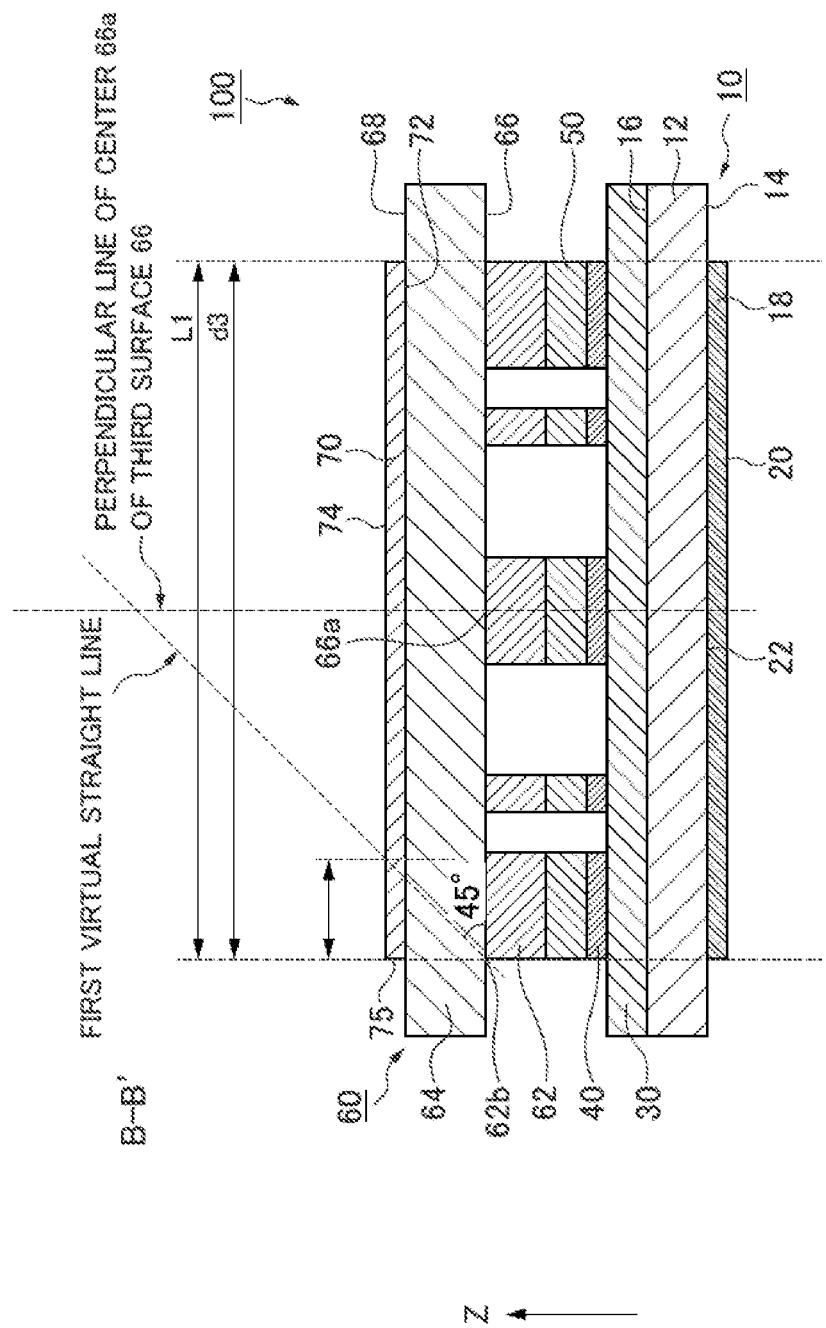
FIG. 3 is an example of a schematic cross-sectional view of the semiconductor device of the first embodiment.

FIGS. 3 and 4 are examples of the schematic cross-sectional view of the semiconductor device 100 of the present embodiment. It is preferable that a first virtual straight line drawn at 45 degrees with respect to the third surface 66 from an end portion 62b on an outermost side of the protrusion portion 62 provided on the outermost side among the plurality of protrusion portions 62 so as to intersect a perpendicular line of a center 66a of the third surface 66 on the fourth surface 68 side passes through the third plate portion 70. FIG. 3 shows an example in which the third outer diameter $d_3$ of the third plate portion 70 is equal to the first diameter $L_1$. The first virtual straight line passes through the third plate portion 70. FIG. 4 shows an example in which the first virtual straight line passes through an upper end of a side surface 75 of the third plate portion 70. When the third outer diameter $d_3$ is smaller than in the example shown in FIG. 4, the first virtual straight line does not pass through the third plate portion 70.

The fourth plate portion 18 includes a seventh surface 20 and an eighth surface 22. The eighth surface 22 of the fourth plate portion 18 is connected to the first surface 14 of the first plate portion 12. The fourth plate portion 18 includes a fourth outer diameter $d_4$ equal to or smaller than the second diameter $L_2$ of a smallest circle circumscribing the plurality of semiconductor chips 40 provided on an outermost side among the plurality of semiconductor chips 40 in the plane parallel to the second surface 16 of the first plate portion 12. In the present specification, the first diameter $L_1$ and the second diameter $L_2$ are assumed to be equal.

FIGS. 5 and 6 are examples of the schematic cross-sectional view of the semiconductor device 100 of the present embodiment. It is preferable that a second virtual straight line drawn at 45 degrees with respect to the second surface 16 so as to intersect a perpendicular line of a center 16a of the second surface 16 on the first surface 14 side from an end portion 40a on the outermost side of the semiconductor chip 40 in the plane perpendicular to the Z-axis or in the plane parallel to the second surface 16 of the first plate portion 12 passes through the fourth plate portion 18. Here, the second virtual straight line is drawn from, for example, a lower surface of the semiconductor chip 40. FIG. 5 shows an example in which the fourth outer diameter $d_4$ of the fourth plate portion 18 is equal to the second diameter $L_2$. The second virtual straight line passes through the fourth plate portion 18. FIG. 6 shows an example in which the second virtual straight line passes through a lower end of a side surface 15 of the fourth plate portion 18. When the fourth outer diameter $d_4$ is smaller than in the example shown in FIG. 6, the first virtual straight line does not pass through the fourth plate portion 18.

Shapes of the first plate portion 12, the second plate portion 64, the third plate portion 70, and the fourth plate portion 18 in the plane perpendicular to the Z-axis are, for example, circular. However, the shapes of the first plate portion 12, the second plate portion 64, the third plate portion 70, and the fourth plate portion 18 in the plane perpendicular to the Z-axis may be a shape in which corners of, for example, a square shape or a rectangular shape are chamfered.

The first plate portion 12 and the fourth plate portion 18 are integrally made from, for example, a single metallic ingot by mechanical grinding or the like.

The protrusion portions 62, the second plate portion 64, and the third plate portion 70 are integrally made from, for example, a single metal ingot by mechanical grinding or the like.

Next, actions and effects of the semiconductor device 100 of the present embodiment will be described.

Figure 7A:
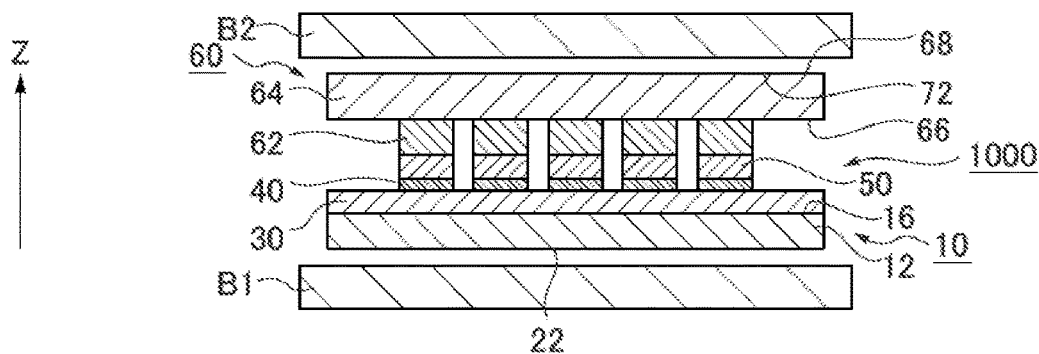
FIGS. 7A to 7C are schematic diagrams of a semiconductor device according to a comparison form of the first embodiment.
Figure 7B:
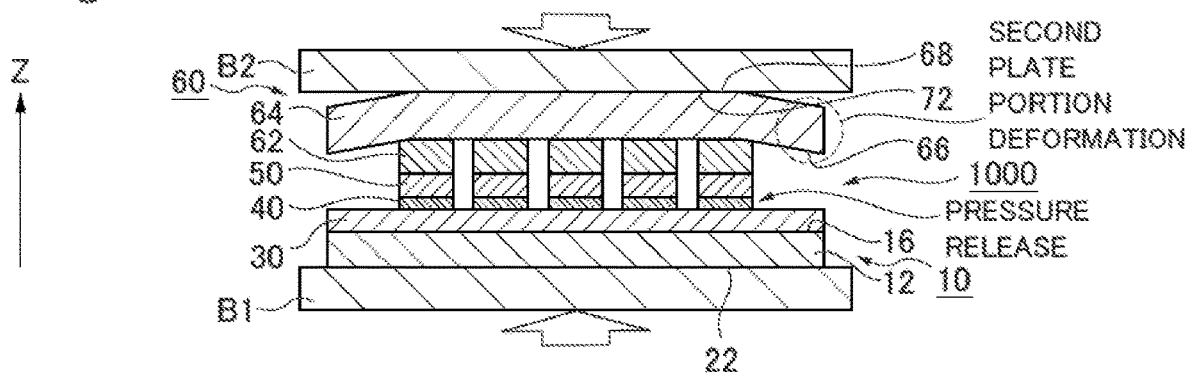
Figure 7C:
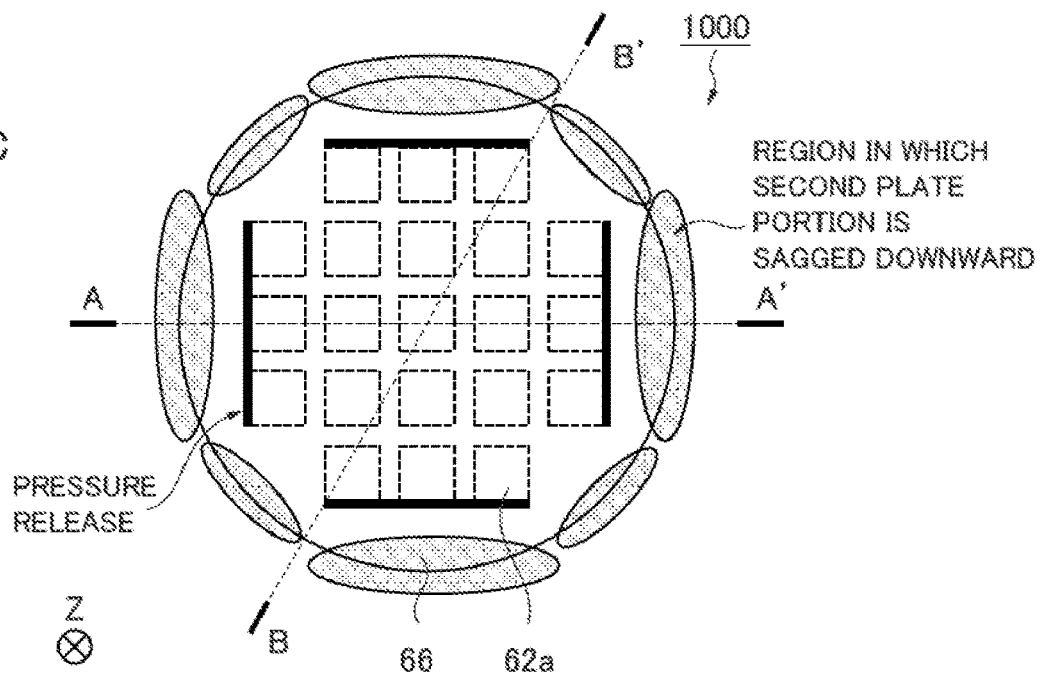

FIGS. 7A to 7C are schematic diagrams of a semiconductor device 1000 as a comparison form of the present embodiment. In the semiconductor device 1000, the fourth plate portion 18 and the third plate portion 70 are not provided. In such a case, due to the use of the semiconductor device 1000, when the semiconductor device 1000 is press-packed from above and below by using a first electrode block $B_1$ and a second electrode block $B_2$ (FIG. 7A), the second plate portion 64 outside the protrusion portion 62 cannot maintain flatness, and thus, there is a problem that the second plate portion is deformed (sagged) downward (FIG. 7B). A region in which the second plate portion 64 is deformed downward is distributed on the outer periphery of the second plate portion 64, for example, as shown in FIG. 7C. At this time, there is a problem that pressure is easy to be released particularly at a portion outside the protrusion portion 62. Thermal resistance of the semiconductor chip 40 under the portion outside the protrusion portion 62 becomes high, and thus, there is a problem that the semiconductor chip 40 is destroyed.

Therefore, the semiconductor device 100 of the present embodiment includes a first electrode 10 including a first plate portion 12, the first plate portion including a first surface 14 and a second surface 16 facing the first surface 14, a plurality of semiconductor chips 40 provided above the second surface 16, and a second electrode 60 including a second plate portion 64 provided above the semiconductor chips 40, the second plate portion including a third surface 66 facing the second surface 16 and a fourth surface 68 facing the third surface 66, the second plate portion including a plurality of protrusion portions 62 provided between the semiconductor chips 40 and the third surface 66, the protrusion portions being connected to the third surface 66, each of the protrusion portions including a top surface 62a including the same shape as a shape of each of the semiconductor chips 40 in a plane parallel to the second surface 16, the second plate portion 64 including a second outer diameter $d_2$ larger than a first diameter $L_1$ of a smallest circle circumscribing the protrusion portions 62 provided on an outermost side among the protrusion portions 62 in a plane parallel to the third surface 66, and the third plate portion including a fifth surface 72 connected to the fourth surface 68 and a sixth surface 74 facing the fifth surface 72, the third plate portion including a third outer diameter $d_3$ equal to or smaller than the first diameter $L_1$.

In the semiconductor device 100 of the present embodiment, in order to suppress the release of pressure with a simple structure, the protrusion portion 62 includes the top surface 62a including the same shape as each semiconductor chip 40 in the plane parallel to the second surface 16. The third plate portion 70 described above is provided.

Figure 8A:
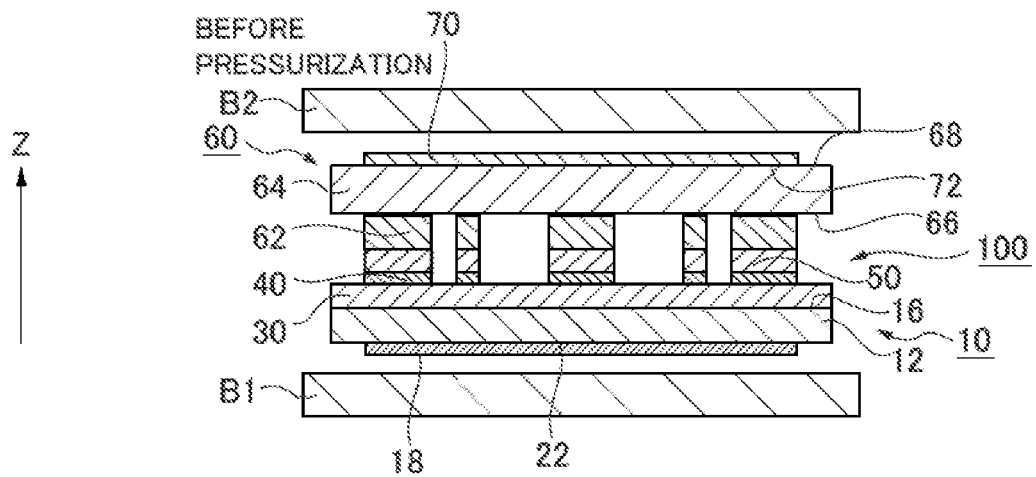
FIGS. 8A and 8B are schematic diagrams for describing actions and effects of the semiconductor device of the first embodiment.
Figure 8B:
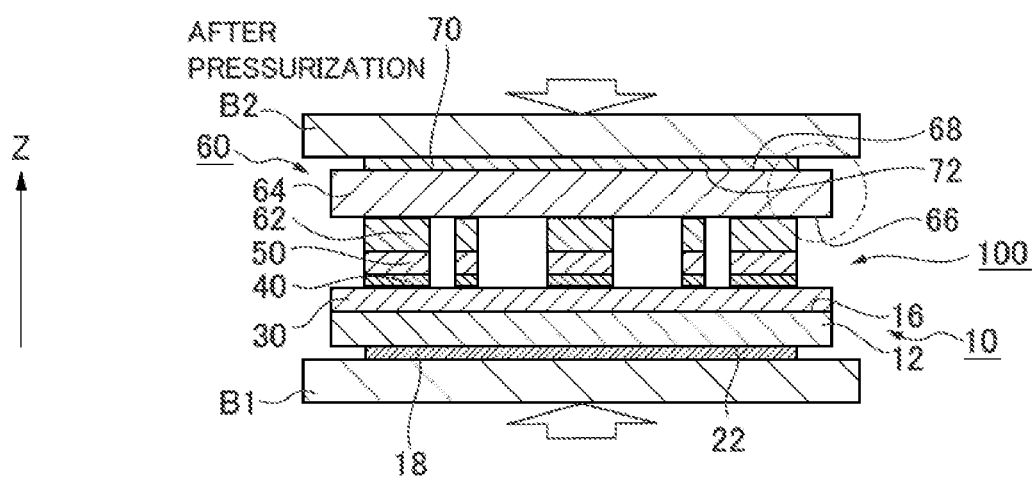

FIGS. 8A and 8B are diagrams for describing the actions and effects of the semiconductor device of the present embodiment. The third plate portion 70 is directly pressed by the second electrode block $B_2$. Here, the third outer diameter $d_3$ of the third plate portion 70 is equal to or smaller than the first diameter $L_1$. Thus, the second plate portion 64 outside the protrusion portion 62 is hard to be deformed downward. Thus, the pressure of the semiconductor chip 40 is hard to be released. Accordingly, a highly reliable semiconductor device can be provided.

Even though the third plate portion 70 is provided, there is no particular change such as a volume change around the protrusion portion 62 and the semiconductor chip 40. Thus, the release of pressure can be easily suppressed.

It is preferable that the first virtual straight line drawn at 45 degrees with respect to the third surface 66 so as to intersect the perpendicular line of the center 66a of the third surface 66 on the fourth surface 68 side from the end portion 62b on the outermost of the protrusion portion 62 provided on the outermost side among the plurality of protrusion portions 62 passes through the third plate portion 70. It is considered that pressure applied to the third plate portion 70 by the second electrode block $B_2$ is dispersed within a range of 45 degrees from a vertical downward direction. Thus, when there is the third plate portion 70 within the above range, it becomes difficult to apply pressure to the second plate portion 64 outside the protrusion portion 62, and thus, the release of pressure of the semiconductor chip 40 is suppressed.

When the first plate portion 12 is pressed by the first electrode block $B_1$, there is a problem that the first plate portion 12 outside the semiconductor chip 40 is deformed upward. Thus, the thermal resistance of the semiconductor chip 40 under the portion outside the protrusion portion 62 becomes high, and thus, there is a problem that the semiconductor chip 40 is destroyed.

Accordingly, it is preferable that the first electrode 10 includes the fourth plate portion 18 that includes the fourth outer diameter $d_4$ equal to or smaller than the second diameter $L_2$ of the smallest circle circumscribing the plurality of semiconductor chips 40 provided on the outermost side among the plurality of semiconductor chips 40 in the plane parallel to the second surface 16 and is connected to the first surface 14. The fourth plate portion 18 is directly pressed by the first electrode block $B_1$. Here, the fourth outer diameter $d_4$ of the fourth plate portion 18 is equal to or smaller than the second diameter $L_2$. Thus, the first plate portion 12 outside the semiconductor chip 40 is hard to be deformed upward. Thus, the pressure of the semiconductor chip 40 is hard to be released. Accordingly, a highly reliable semiconductor device can be provided.

Even though the fourth plate portion 18 is provided, there is no particular change such as a volume change around the protrusion portion 62 and the semiconductor chip 40. Thus, the release of pressure can be easily suppressed.

It is preferable that the second virtual straight line drawn at 45 degrees with respect to the second surface 16 so as to intersect the perpendicular line of the center 16a of the second surface 16 on the first surface 14 side from the end portion 40a on the outermost side of the semiconductor chip provided on the outermost side among the plurality of semiconductor chips 40 passes through the fourth plate portion 18. It is considered that pressure applied to the fourth plate portion 18 by the first electrode block $B_1$ is dispersed within a range of 45 degrees from the vertical upward direction. Thus, when there is the fourth plate portion 18 within the above range, it becomes difficult to apply pressure to the first plate portion 12 outside the plurality of semiconductor chips 40, and thus, the release of pressure of the semiconductor chip 40 is suppressed.

According to the semiconductor device 100 of the present embodiment, a highly reliable semiconductor device can be provided.

Second Embodiment

A semiconductor device of the present embodiment includes a first electrode including a first plate portion, the first plate portion including a first surface and a second surface facing the first surface, a plurality of semiconductor chips provided above the second surface, and a second electrode including a second plate portion provided above the semiconductor chips, the second plate portion including a third surface facing the second surface and a fourth surface facing the third surface, the second electrode including a plurality of protrusion portions provided between the semiconductor chips and the third surface, the protrusion portions being connected to the third surface, the second plate portion including a second outer diameter equal to a first diameter of a smallest circle circumscribing the protrusion portions provided on an outermost side among the protrusion portions in a plane parallel to the third surface. Here, the description of the contents overlapping with the first embodiment will be omitted.

FIGS. 9A and 9B are schematic cross-sectional views of a semiconductor device 110 of the present embodiment.

The second plate portion 64 includes the second outer diameter $d_2$ equal to the first diameter $L_1$ of the smallest circle circumscribing the protrusion portions 62 provided on the outermost side among the protrusion portions 62 in the plane parallel to the third surface 66. The first outer diameter $d_1$ of the first plate portion 12 is equal to the second diameter $L_2$ of the smallest circle circumscribing the plurality of semiconductor chips 40 provided on the outermost side among the plurality of semiconductor chips 40 in the plane parallel to the second surface 16. In the present embodiment, the first diameter $L_1$ and the second diameter $L_2$ are assumed to be equal.

The second outer diameter $d_2$ of the second plate portion 64 is equal to the first diameter $L_1$. The first outer diameter $d_1$ of the first plate portion 12 is equal to the second diameter $L_2$. In FIGS. 9A and 9B, $d_2=L_1=L_2=d_1$.

Thus, the second plate portion 64 outside the protrusion portion 62 is hard to be deformed downward. The first plate portion 12 outside the semiconductor chip 40 is hard to be deformed upward. Accordingly, the release of pressure of the semiconductor chip 40 is suppressed.

According to the semiconductor device 110 of the present embodiment, a highly reliable semiconductor device can also be provided.

Third Embodiment

A semiconductor device of the present embodiment includes a first electrode including a first plate portion, the first plate portion including a first surface and a second surface facing the first surface, a plurality of semiconductor chips provided above the second surface, and a second electrode including a second plate portion provided above the semiconductor chips, the second plate portion including a third surface facing the second surface and a fourth surface facing the third surface, the second plate portion including a plurality of protrusion portions provided between the semiconductor chips and the third surface, the protrusion portions being connected to the third surface, the second plate portion including a second outer diameter larger than a first diameter of a smallest circle circumscribing the protrusion portions provided on an outermost side among the protrusion portions in a plane parallel to the third surface, and a fifth plate portion provided on the third surface between an end portion of the third surface and the protrusion portion provided on the outermost side among the protrusion portions. Here, the description of the contents overlapping with the first embodiment and the second embodiment will be omitted.

Figure 10B:
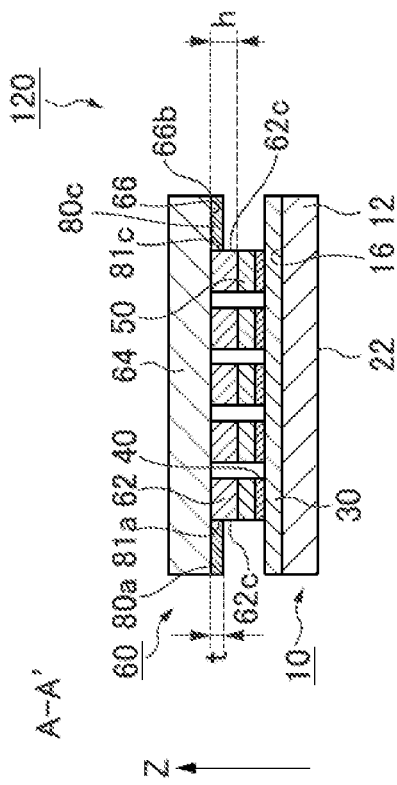
FIGS. 10A to 10C are schematic cross-sectional views of a semiconductor device of a third embodiment.
Figure 10A:
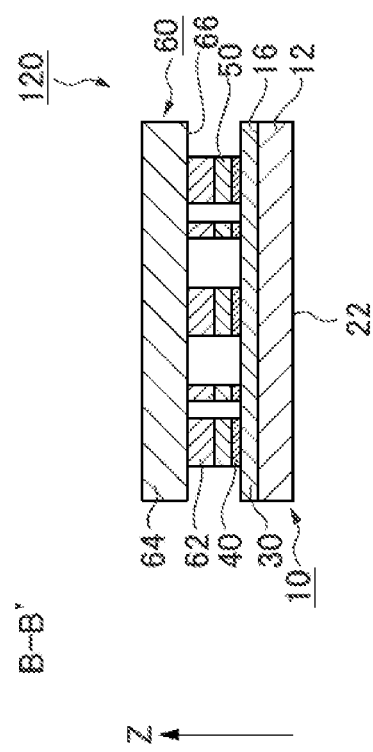
Figure 10C:
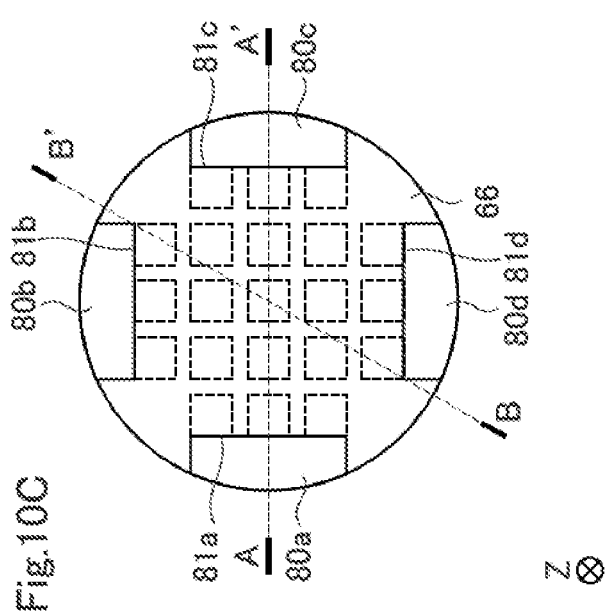

FIGS. 10A to 10C are schematic cross-sectional views of a semiconductor device 120 of the present embodiment.

A fifth plate portion 80 is provided on the third surface 66 between an end portion 66b of the third surface 66 and the protrusion portion 62 provided on the outermost side among the plurality of protrusion portions 62. Specifically, a fifth plate portion 80a, a fifth plate portion 80b, a fifth plate portion 80c, and a fifth plate portion 80d are provided.

Due to the fifth plate portion 80, the second plate portion 64 outside the protrusion portion 62 provided on the outermost side among the plurality of protrusion portions 62 is hard to be deformed downward. Accordingly, the release of pressure of the semiconductor chip 40 is suppressed.

It is preferable that a side surface 81 of the fifth plate portion 80 is in contact with an outer surface (side surface) 62c of the protrusion portion 62 provided on the outermost side among the plurality of protrusion portions 62. The side surface 81 of the fifth plate portion 80 is in contact with the outer surface 62c of the protrusion portion 62, and thus, strength of the second plate portion 64 outside the protrusion portion 62 further increases. Accordingly, the second plate portion is hard to be deformed downward. In FIG. 10B, the side surface 81a of the fifth plate portion 80a and the side surface 81c of the fifth plate portion 80c are illustrated. In FIG. 10C, the side surface 81a of the fifth plate portion 80a, the side surface 81b of the fifth plate portion 80b, the side surface 81c of the fifth plate portion 80c and the side surface 81d of the fifth plate portion 80d are illustrated.

It is preferable that a height t of the fifth plate portion 80 perpendicular to the third surface 66 is 20% or more of a height h of the protrusion portion 62 perpendicular to the third surface 66 in order to increase the strength of the second plate portion 64 outside the protrusion portion 62.

According to the semiconductor device 120 of the present embodiment, a highly reliable semiconductor device can also be provided.

Although some embodiments and examples of the present disclosure have been described, these embodiments and examples are presented as examples and are not intended to limit the scope of the disclosure. These novel embodiments can be implemented in various other embodiments, and various omissions, replacements, and changes can be made without departing from the gist of the disclosure. These embodiments and modifications thereof are included in the scope and gist of the disclosure, and are also included in the scope of the disclosure described in the claims and the equivalent scope thereof.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first electrode including a first plate portion, the first plate portion including a first surface and a second surface opposite to the first surface;
    a plurality of semiconductor chips provided above the second surface;
    a second electrode including:
        a second plate portion provided above the semiconductor chips, the second plate portion including a third surface facing the second surface and a fourth surface opposite to the third surface, and
        a plurality of protrusion portions provided between the semiconductor chips and the second plate portion, the protrusion portions protruding from the third surface, the second plate portion having a second outer diameter larger than a first diameter of a smallest circle circumscribing the protrusion portions provided on an outermost side among the protrusion portions in a plane parallel to the third surface; and
    a fifth plate portion provided between the first electrode and the second plate portion and between an end portion of the third surface and the protrusion portion provided on the outermost side among the protrusion portions,
    wherein a side surface of the fifth plate portion is in contact with side surfaces of protrusion portions provided on the outermost side among the plurality of protrusion portions.

2. The semiconductor device according to claim 1, wherein a height of the fifth plate portion perpendicular to the third surface is 20% or more of a height of the protrusion portion perpendicular to the third surface.

3. The semiconductor device according to claim 1, wherein each of the protrusion portions includes the top surface having the same size as the size of each of the semiconductor chips in the plane parallel to the second surface.

4. The semiconductor device according to claim 1, wherein the side surface of the fifth plate portion is in direct contact with the side surface of the protrusion portion provided on the outermost side among the protrusion portions.

* * * * *